US007956521B2

(12) United States Patent
Brown

(10) Patent No.: US 7,956,521 B2

(45) Date of Patent: Jun. 7, 2011

(54) ELECTRICAL CONNECTION OF A SUBSTRATE WITHIN A VACUUM DEVICE VIA ELECTRICALLY CONDUCTIVE EPOXY/PASTE

(75) Inventor: Benjamin Brown, Glade Hill, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 353 days.

(21) Appl. No.: 12/170,562

(22) Filed: Jul. 10, 2008

(65) Prior Publication Data

US 2010/0006765 A1 Jan. 14, 2010

(51) Int. Cl.
*H01J 43/00* (2006.01)

(52) U.S. Cl. ............................. 313/103 CM; 313/103 R

(58) Field of Classification Search .............. 313/103 R, 313/103 CM, 105 CM, 377; 250/207, 370.08; 438/60; 257/E31.001, 183.1, 251, 678, 700, 257/703, 719, 697, 734, 783, 784, E21.456, 257/E29.227, E51.048

See application file for complete search history.

(56) References Cited

U.S. PATENT DOCUMENTS

| | | | | |
|---|---|---|---|---|
| 5,021,888 | A | 6/1991 | Kondou et al. | |
| 6,583,558 | B1 | 6/2003 | Suyama et al. | |
| 7,110,160 | B2 | 9/2006 | Patel et al. | |
| 7,199,345 | B1 * | 4/2007 | Meisel et al. | 250/207 |
| 2002/0004251 | A1 * | 1/2002 | Roberts et al. | 438/26 |
| 2004/0185742 | A1 | 9/2004 | Iosue | |
| 2004/0188816 | A1 * | 9/2004 | Minami et al. | 257/678 |

FOREIGN PATENT DOCUMENTS

EP 1 760 758 A2 3/2007

OTHER PUBLICATIONS

Tano, Valeria, EPO Examiner, European Search Report for EP 09 15 4657, EPO, Munich, DE.

Rouzier, Brice, Primary Examiner EPO, Office Action of Corresponding EP Application No. 09 154 657.2-2208, Dated Jul. 30, 2010.

Rouzier, Brice, Primary Examiner EPO, Office Action of Corresponding EP Application No. 09 154 657.2-2208, Dated Oct. 27, 2010.

Rouzier, Brice, Primary Examiner EPO, Office Action of Corresponding EP Application No. 09 154 657.2-2208, Dated Feb. 3, 2011.

* cited by examiner

*Primary Examiner* — Nimeshkumar D Patel
*Assistant Examiner* — Donald L Raleigh
(74) *Attorney, Agent, or Firm* — RatnerPrestia

(57) ABSTRACT

An image intensifier includes a microchannel plate (MCP) having an output surface, and a ceramic substrate having an outer surface. The output surface of the MCP and the outer surface of the ceramic substrate are oriented facing each other. An imager is substantially buried within the ceramic substrate, and an input surface of the imager is exposed to receive electrons from the output surface of the MCP. The input surface of the imager and the outer surface of the ceramic substrate are oriented in substantially the same plane. The input surface of the imager and the outer surface of the ceramic substrate are disposed at a very close distance from the output surface of the MCP. The imager includes input/output pads, and the ceramic substrate includes input/output pads. A conductive epoxy connects a respective input/output pad of the imager to a respective input/output pad of the ceramic substrate.

6 Claims, 4 Drawing Sheets

ELECTRICAL CONNECTION OF A SUBSTRATE WITHIN A VACUUM DEVICE VIA ELECTRICALLY CONDUCTIVE EPOXY/PASTE

FIELD OF THE INVENTION

The present invention relates, in general, to vacuum devices, such as image intensifier tubes. More specifically, the present invention relates to an electron gain device, such as a microchannel plate (MCP), configured for close contact to an electron sensing device, such as a CMOS imager.

BACKGROUND OF THE INVENTION

Image intensifying devices may use solid state sensors, such as CMOS or CCD devices. Image intensifier devices amplify low intensity light or convert non-visible light Into regularly viewable images. Image intensifier devices have many industrial and military applications. For example, image intensifier tubes may be used for enhancing the night vision of aviators, photographing astronomical events and providing night vision to sufferers of night blindness.

There are three types of image intensifying devices: image intensifier tubes for cameras, solid state CMOS (complementary metal oxide semiconductor) and CCD (charge coupled device) sensors, and hybrid EBCCD/CMOS (electronic bombarded CCD or CMOS) sensors.

Referring to FIG. 1, there is shown a schematic diagram of an image intensifier tube, generally designated as 10. As shown, light energy 14 reflected from object 12 impinges upon photocathode 16. Photocathode 16 receives the incident energy on input surface 16*a* and outputs the energy, as emitted electrons, on output surface 16*b*. The output electrons, designated as 20, from photocathode 16, are provided as an input to an electron gain device, such as MCP 18. The MCP includes input surface 18*a* and output surface 18*b*. As electrons bombard input surface 18*a*, secondary electrons are generated within micro-channels 22 of MCP 18. The MCP generates several hundred electrons for each electron entering input surface 18*a*.

Although not shown, it will be understood that MCP 18 is subjected to a difference in voltage potential between input surface 18*a* and output surface 18*b*, typically over a thousand volts. This potential difference enables electron multiplication. Electrons 24 are outputted from MCP 18 and impinge upon solid state electron sensing device 26. Electron sensing device 26 may be a CMOS imager, for example, and includes input surface 26*a* and output surface 26*b*, as shown in FIG. 1. Electron sensing device 26 may be fabricated as an integrated circuit, using CMOS processes.

In general, the CMOS imager employs electron sensing elements. Input surface 26*a* includes an active receive area sensitive to the received electrons from MCP 18. The output signals of the electron sensing elements may be provided, at output surface 26*b* (actually an output surface of a ceramic header), as signals whose magnitudes are proportional to the amount of electrons received by the electron sensing elements. The number of electrons Is proportional to incoming photons at the cathode. CMOS imagers use less power and have lower fabrication cost compared to imagers made by CCD processes.

The output of CMOS imager 26 produces an intensified image signal that may be sent, by way of a bus, to image display device 28. The output of CMOS imager 26 may be, alternatively, stored in a memory device (not shown).

To facilitate the multiplication of electrons between the input of the image intensifier tube, at input surface 16*a*, and the output of the image intensifier tube, at output surface 26*b*, a vacuum housing is provided. As shown, photocathode 16, MCP 18 (or other electron gain device) and CMOS imager 26 (or other electron sensing device) are packaged in vacuum housing 29. In addition to providing a vacuum housing, input surface 26*a* of the CMOS imager and output surface 18*b* of the MCP are required to physically be very closely spaced from each other.

Such close spacing presents a problem, because a conventional silicon die of a CMOS Imager, for example, includes wires looping above the input surface of the imager for outputting the intensified image signal. Because these wires flare out from the silicon die and loop above the input surface, before they are connected to bond pads on a ceramic carrier holding the silicon die, it is difficult to closely space the input surface of the imager to the output surface of the MCP.

As an example, a conventional silicon die is shown in FIGS. 2*a* and 2*b*. As shown, chip 30 includes silicon die 32 attached to ceramic carrier 34 (also referred to herein as header 34). The silicon die includes an array of terminal pads 36 for providing input/output (I/O) signals. Hundreds of terminal pads 36 are typically disposed around the peripheral circumference of silicon die 32. Also shown in FIGS. 2*a* and 2*b* is an array of pads 38 disposed on ceramic carrier 34. Leads or wires 40 are attached by ultrasonic bonding of wires between I/O pads 36 and I/O pads 38, thereby making electrical contact between them. Extending from the bottom of ceramic carrier 34 are a plurality of pins 42, as shown in FIG. 2*b*, which are connected through via-holes (for example, 39*a* and 39*b*) to the array of bond pads 38. In this manner, electrical contacts are made between bond pads 36 on silicon die 32 and the input/output of the chip, at the plurality of pins 42.

In a typical conventional configuration, wires 40 loop above the planar top surface of silicon die 32 and then descend down toward ceramic carrier 34, as shown in FIG. 2*b*. These wire loops above silicon die 32, in the case of a conventional CMOS imager (for example), prevent a tight vertical placement between the top active surface area of silicon die 32 and the output surface area of electron gain device 18. As best shown in FIG. 2*c*, output surface 18*b* of electron gain device 18 is placed in close vertical proximity to the input surface area of silicon die 32. Because of the looping of wires 40, however, it is not possible to reduce the vertical space between output surface 18*b* and the top surface of silicon die 32. The lowest wire bond profile is limited to the wire bond height plus a vertical clearance to assure the wires do not contact the silicon surface and become shorted. The vertical clearance is also limited to the bondwire loop height plus a distance required to provide a voltage standoff between the output surface of the electron gain device and the input surface of the electron sensing device.

As will be explained, the present invention addresses this shortcoming by providing an electron sensing device with a pocket, which may receive an electron sensing device and permit a tight interface, or small clearance between the electron sensing device and the electron gain device (for example, an MCP).

SUMMARY OF THE INVENTION

To meet this and other needs, and in view of its purposes, the present invention provides an image intensifier including a microchannel plate (MCP) having an output surface, and a ceramic substrate having an outer surface. The output surface of the MCP and the outer surface of the ceramic substrate are oriented facing each other. An imager is substantially buried within the ceramic substrate, and an input surface of the imager Is exposed to receive light from the output surface of the MCP.

The input surface of the imager and the outer surface of the ceramic substrate are oriented in substantially the same plane. The input surface of the imager and the outer surface of the ceramic substrate are disposed at a distance from the output surface of the MCP that is less than or equal to 0.005 inches.

The imager includes input/output pads, and the ceramic substrate includes other input/output pads. A conductive epoxy connects a respective input/output pad of the imager to a respective input/output pad of the ceramic substrate. Multiple conductive epoxies may connect multiple input/output pads of the imager to multiple input/output pads of the ceramic substrate.

The imager may include a CMOS (complementary metal oxide semiconductor) device, or a CCD (charge coupled device).

The ceramic substrate includes a pocket having a seat at a predetermined depth. The imager is configured to be received in the pocket, with a bottom surface of the imager disposed directly on top of the seat. The top surface of the ceramic substrate and the input surface of the imager are substantially coplanar. A conductive epoxy spans between (a) input/output pads disposed on the input surface of the imager and (b) input/output pads disposed on the top surface of the ceramic substrate for electrically connecting the imager to the ceramic substrate. A non-conductive epoxy may be deposited in the pocket. The non-conductive epoxy is configured to fill gaps between (a) end surfaces of the Imager inserted in the pocket and (b) walls of the pocket.

Another embodiment of the present invention includes an image intensifier including an electron gain device having an output surface; and an electron sensing device having an input surface, positioned below the output surface of the electron gain device, for receiving light from the output surface of the electron gain device. A ceramic substrate is disposed below the output surface of the electron gain device for housing the electron sensing device. A top surface of the ceramic substrate is substantially coplanar with the input surface of the electron sensing device. The ceramic substrate includes a pocket for housing the electron sensing device. The pocket is of a predetermined depth so that the top surface of the ceramic substrate is substantially coplanar with the input surface of the electron sensing device. Input/output pads are disposed on the top surface of the ceramic substrate. Input/output pads are disposed on the input surface of the electron sensing device. Multiple conductive epoxy spans are included for electrically connecting the input/output pads of the ceramic substrate and the electron sensing device. Non-conductive epoxy is disposed below at least one conductive epoxy span for providing support to the at least one conductive epoxy span.

Yet another embodiment of the present invention is a method of making an image intensifier. The method includes the steps of: forming a pocket in a ceramic substrate; housing an imager in the pocket of the ceramic substrate; and spanning conductive epoxy between input/output pads of the ceramic substrate and the imager.

The step of forming a pocket includes forming a seat in the pocket at a predetermined depth; and the step of housing includes placing the ceramic substrate on top of the seat in the pocket, so that the top surface of the imager is coplanar with the top surface of the ceramic substrate.

The method of making an image intensifier may include the step of: inserting a non-conductive epoxy in gaps formed between edges of the ceramic substrate and edges of the imager. Furthermore, the step of spanning includes spanning the conductive epoxy in a horizontal direction across the gaps that have been filled with the non-conductive epoxy. After housing the imager in the pocket of the ceramic substrate, an output surface of an MCP is placed proximate to an input surface of the imager.

BRIEF DESCRIPTION OF THE FIGURES

The invention may be understood from the following detailed description when read in connection with the following figures.

DETAILED DESCRIPTION OF THE INVENTION

Figure 3A:
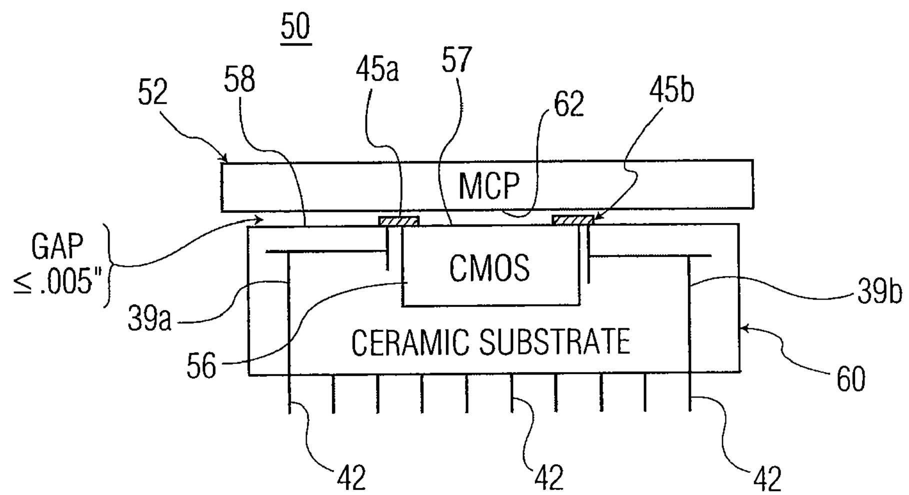
FIG. 3*a* is a sectional view of an electron sensing device spaced below and in close vertical proximity to an electron gain device, in accordance with an embodiment of the invention.
Figure 3B:
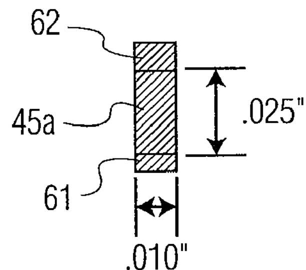
FIG. 3*b* is a top cross-sectional view of a conductive epoxy/paste for electrically connecting the electron gain device to the header shown in FIG. 3*a*, in accordance with an embodiment of the invention.

Referring now to FIGS. 3*a* and 3*b*, there is shown an exemplary image intensifier, generally designated as 50. Image intensifier 50 includes an electron gain device, designated as 52, for example a microchannel plate (MCP). Image intensifier 50 also includes an electron sensing device, designated as 56, disposed within ceramic substrate 60. Electron sensing device 56 may include, for example, a solid state CMOS (complimentary metal oxide semiconductor) sensor, a CCD (charge couple device) sensor, or a hybrid electron bombarded CCD or CMOS sensor.

Figure 1:
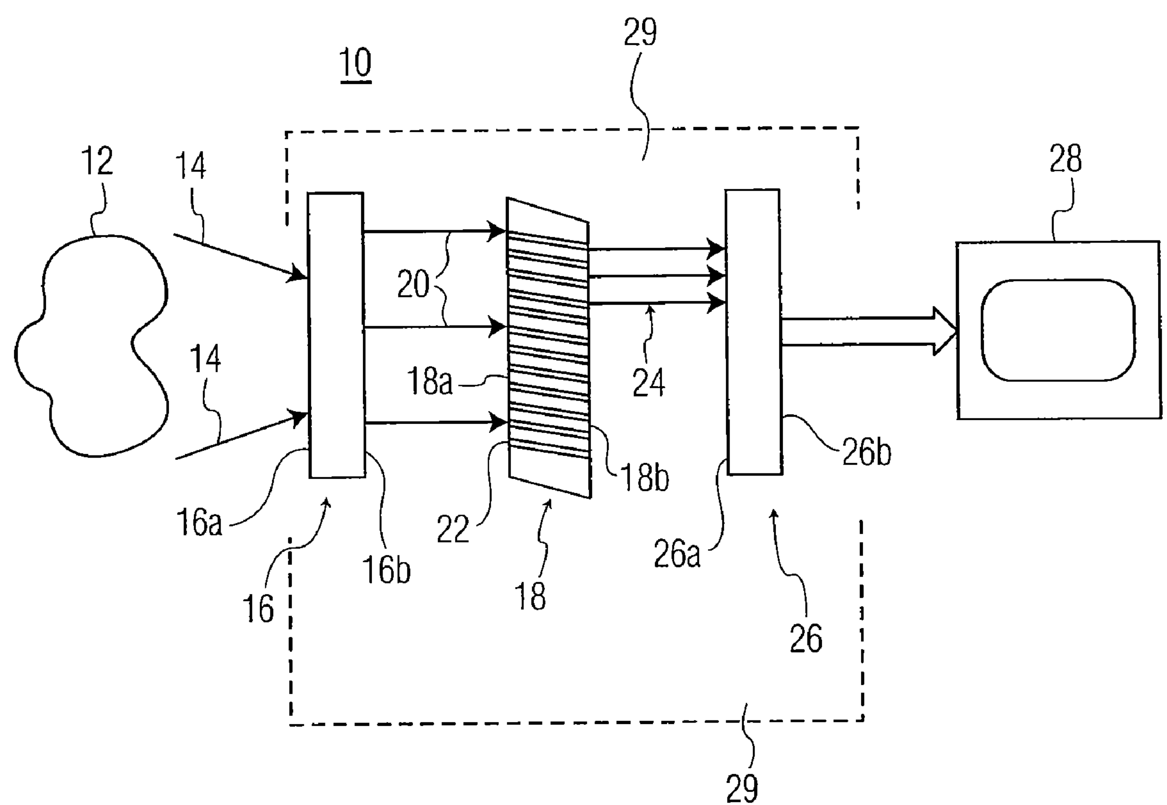
FIG. 1 is a schematic illustration of a typical image intensifier tube, including an electron gain device and an electron sensing device.

As shown, electron gain device 52 is disposed above electron sensing device 56. The electron gain device Includes an active region, generally designated as 62. It will be appreciated that the top surface of active region 62 includes an active receiving area sensitive to received electrons from a photocathode (shown as 16 in FIG. 1), the latter disposed vertically above electron gain device 52. Electron gain device 52 receives incident energy on its input surface and outputs amplified energy, as emitted electrons, on its output surface of active region 62. The output electrons are provided as an input to electron sensing device 56. For example, electron gain device 52, such as an MCP, generates several hundred electrons for each electron entering at the input surface.

As shown, active region 62 is disposed vertically above electron sensing device 56. The electron sensing device 56 receives the output electrons from electron gain device 52 and provides an output signal that is proportional to the amount of electrons received by the electron sensing device. Electrical connections are made between top surface 57 of electron sensing device 56 and top surface 58 of ceramic substrate 60. This is described further below.

Figure 2A:
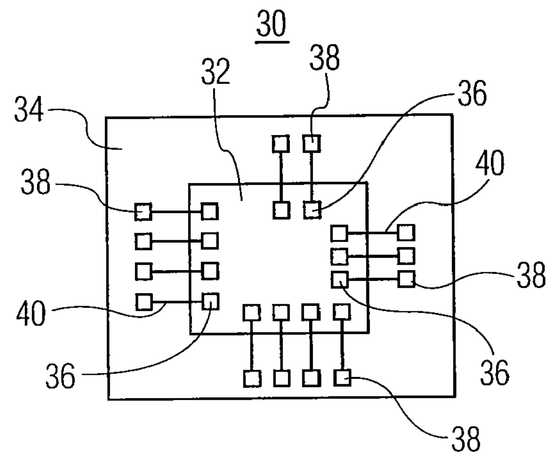
FIG. 2*a* is a top view of an electron sensing device formed in a conventional manner, showing a ceramic header and bondwires.
Figure 2B:
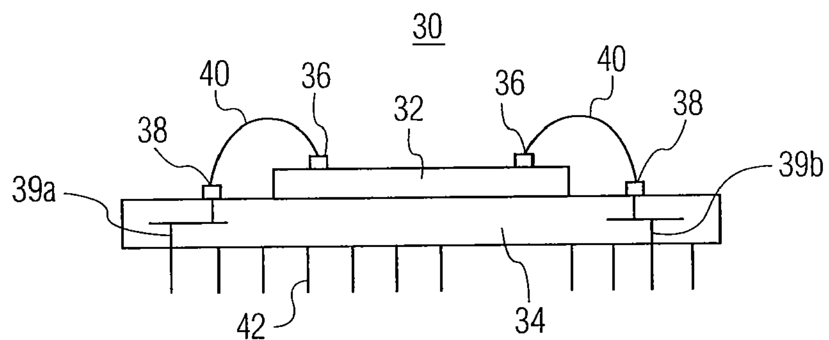
FIG. 2*b* is a sectional view of the electron sensing device shown in FIG. 2*a*.
Figure 2C:
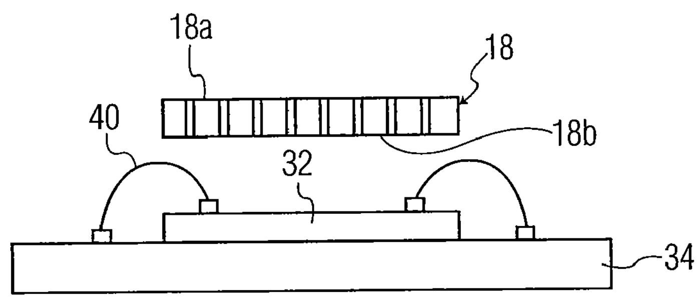
FIG. 2*c* is a sectional view of a conventional electron sensing device, spaced in vertical proximity to and below an electron gain device, when integrated together in an image intensifier tube.

In accordance with an embodiment of the present invention, an electronic sensing device, for example CMOS device 56, is buried within ceramic substrate 60, so that top surface 57 of CMOS device 56 is substantially coplanar with top surface 58 of ceramic substrate 60. It will be appreciated that CMOS device 56 includes an array of terminal pads disposed around the peripheral circumference of CMOS device 56. An exemplary array of terminal pads is shown in FIG. 2*a* designated as an array of terminal pads 36. The array of terminal pads 36 provides various input/output (I/O) signals to or from the CMOS device.

Similarly, an array of terminal pads is disposed on ceramic substrate 60. The array of terminal pads may be similar to the exemplary array of terminal pads 38, shown in FIG. 2*a*, disposed around the circumference of ceramic substrate 34.

As best shown in FIG. 3*a*, a plurality of pins 42 are extended from the bottom of ceramic substrate 60. The pins are electrically connected through via-holes, for example, via holes 39*a* and 39*b*, to the array of bond pads disposed on top surface 58 of ceramic substrate 60.

In accordance with the present invention, spans of epoxy/paste (where only two are shown designated as 45*a* and 45*b*) are extended between the array of pads disposed on top surface 57 and the array of pads disposed on top surface 58. In this manner, electrical connections are made between the bond pads of CMOS device 56 and the input/output pins 42 of ceramic substrate 60.

The electrical conductor epoxy/paste may be obtained by filling a regular non-electrode conductor with a conductor material, such as silver, gold or carbide. External power sources and signal sources (for example, data and control signals) may be transferred to the CMOS device through the input/output pins placed at the bottom of the ceramic substrate.

Because the CMOS device is buried within the ceramic substrate, the gap between the CMOS device and the output surface 62 of MCP 52 may be made very small. For example, the gap may be made smaller than or equal to 0.005 inches.

Figure 3C:
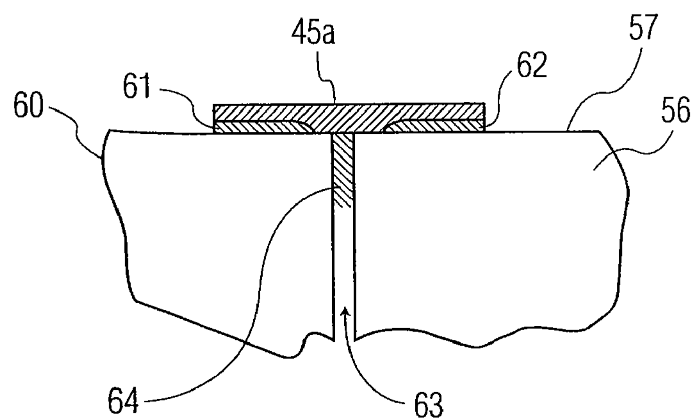
FIG. 3*c* is a cross-sectional view of a conductive epoxy/paste spanning between a CMOS device and a header, in accordance with an embodiment of the present invention.

There are many ways to extend the electrical connections between CMOS device 56 and ceramic substrate 60. Referring to FIGS. 3*a* and 3*c*, there is shown an example of a span made of conductive epoxy/paste, designated as 45*a*, which electrically connects bond pads 61 and 62. As shown, bond pad 61 is part of the array of bond pads formed on top surface 58 of ceramic substrate 60. Similarly, bond pad 62 is part of an array of bond pads formed on top surface 57 of CMOS device 56.

As shown in FIG. 3*c*, spans 45*a* fills the gap between the ends of bond pads 61 and 62. It will be appreciated that bond pads 61 and 62 are aligned so that when CMOS device 56 Is inserted within the pocket formed in ceramic substrate 60, conductive epoxy/paste span 45*a* provides the electrical connection between the two bond pads. Bond pad 61 is electrically connected to at least one of the input/output pins 42 in ceramic substrate 60 and, similarly, bond pad 62 is electrically connected to at least one function (not shown) performed by CMOS device 56. The array of bond pads formed on top of surface 58 and the array of bond pads formed on top of surface 57 may have any suitable shape, such as pads, strips, frames, or segments. In additions, the bond pads may be positioned at any desired locations on CMOS device 56 and ceramic substrate 60.

The span 45*a* may include many suitable materials, for example, span 45*a* may include an electrically conductive adhesive which may be a conductive epoxy. Specifically, the electrically conductive epoxy may be a standard epoxy filled with an electrically conductive material, such as metal elements (for example gold and silver), metalloids, or other material such as carbon, which by filling the standard epoxy results in a conductive epoxy, or carbides of metal elements. The conductive adhesive may also include an electrically conductive organic (or polymer) material or an electrically non-conductive organic (or polymer) material filled with a conductive material.

Each conductive epoxy/paste span 45*a* extends across gap 63 formed between a wall in the pocket of ceramic substrate 60 and a wall (or edge) of CMOS device 56 (as shown in FIG. 3*c*). In order to provide additional support for electrically conductive span 45*a*, the present invention may include a non conductive paste, inserted as a filler in gap 63. The non-conductive paste is designated as 64 in FIG. 3*c*.

Exemplary dimensions of a conductive span, formed between pad 62 on CMOS device 56 and pad 61 on ceramic substrate 60 are provided in FIG. 3*b*. The width is shown as 0.010 inches (may vary between 0.002-0.012 inches). The length is shown as 0.025 inches (may vary between 0.015-0.050 inches).

Figure 4:
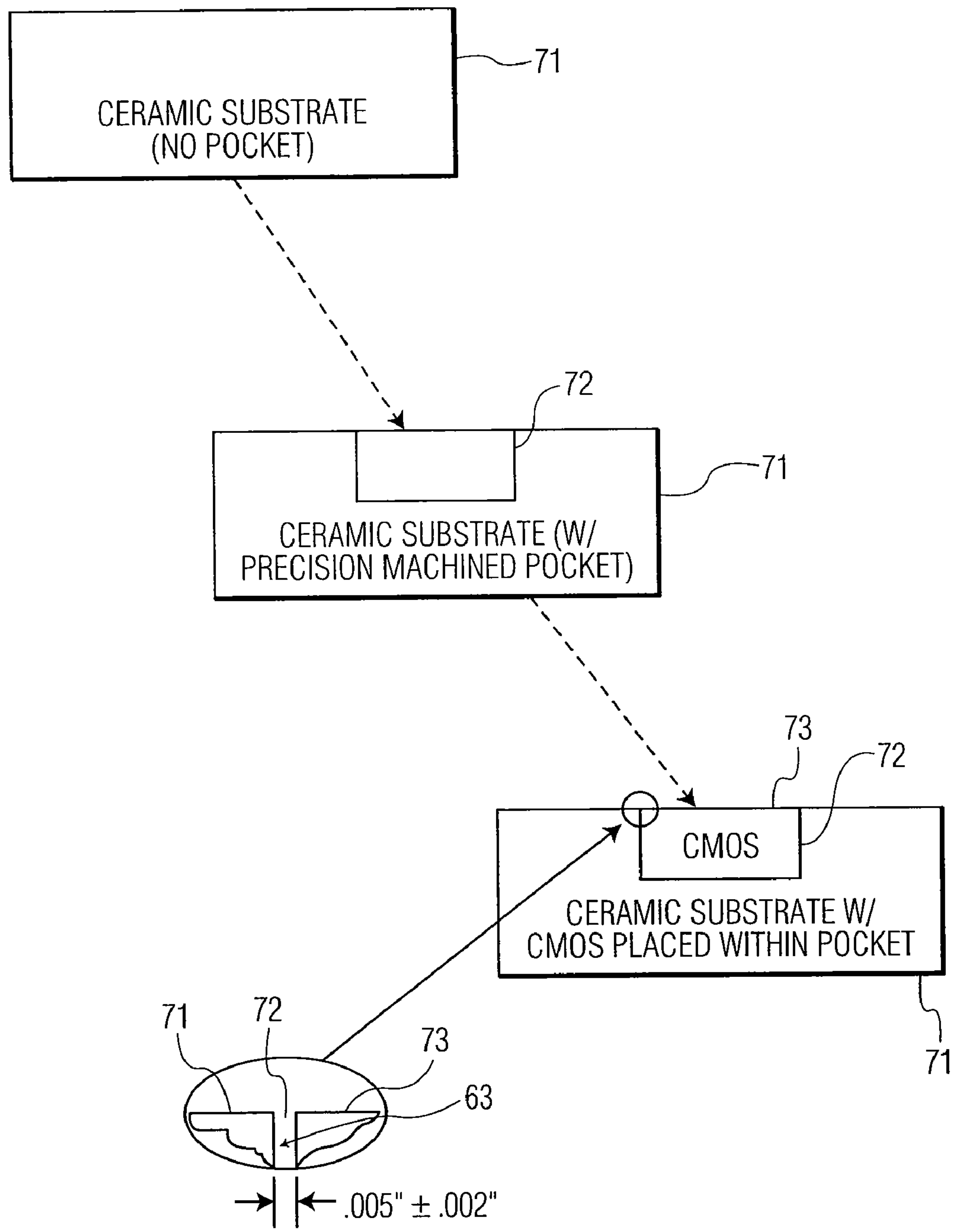
FIG. 4 is a functional flow diagram showing various stages in making the electron sensing device of the present invention.

Referring now to FIG. 4, there is shown a functional flow diagram, depicting various stages in the making of the present invention. As shown, a first stage may be the ceramic substrate without any pockets, generally designated as 71. The next stage may be ceramic substrate 71, after having been precision machined to form pocket 72. The final stage may be semiconductor device 73 (for example CMOS device 73) inserted within pocket 72 of ceramic substrate 71.

A blow up of gap 63 formed between CMOS device 73 and ceramic substrate 71 is shown at the bottom of FIG. 4. As shown, gap 63 may be constructed to provide a clearance of 0.005 inches, plus or minus 0.002 inches. Gap 63 may be filled with a non-conductive epoxy, such as epoxy 64 shown in FIG. 3*c*.

The bonding process for connecting span 45*a* between bond pads 61 and 62 may be performed in many ways, according to the specific bonding agents used. As an example, bond pads 61 and 62 may be aligned after insertion of CMOS device 56 within pocket 72 of ceramic substrate 71. Conductive electrical span 45*a* (and, of course, multiple other spans) may be deposited as paste or epoxy across gap 63 in order to electrically join bond pads 61 and 62. The bonding agent may then be cured at selective temperatures. The bonding agent may also be cured with UV or (IR) light when the bonding agent includes UV or (IR) curable epoxy. After such curing, the span and the bond pads may also be pressed together with optional external pressure.

The present invention may be used for any application that requires a close proximity between two devices, where physical clearance between the two devices is an issue. The physical clearance Issue does not necessarily have to result from bond wires looping above a top surface of a device, but may result from any physical body protruding above another body.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An image intensifier comprising a microchannel plate (MCP) having an output surface, and a ceramic substrate having an outer surface, wherein the output surface of the MCP and the outer surface of the ceramic substrate are oriented facing each other, an imager is substantially buried within the ceramic substrate, and an input surface of the imager is exposed to receive electrons from the output surface of the MCP; and the ceramic substrate includes a pocket having a seat at a predetermined depth, the imager is configured to be received in the pocket, a bottom surface of the imager is disposed directly on top of the seat, and the top surface of the ceramic substrate and the input surface of the imager are substantially coplanar;

a conductive epoxy spans between (a) input/output pads disposed on the input surface of the imager and (b) input/output pads disposed on the top surface of the ceramic substrate for electrically connecting the imager to the ceramic substrate; and a non-conductive epoxy is deposited in the pocket, and the non-conductive epoxy is configured to fill gaps between (a) end surfaces of the imager inserted in the pocket and (b) walls of the pocket.

2. The image intensifier of claim 1 wherein the input surface of the imager and the outer surface of the ceramic substrate are disposed at a distance from the output surface of the MCP that is less than or equal to 0.005 inches.

3. The image intensifier of claim 1 wherein the imager includes a CMOS (complementary metal oxide semiconductor) device.

4. The image intensifier of claim 1 wherein the imager includes a CCD (charge coupled device).

5. An image intensifier comprising an electron gain device having an output surface, an electron sensing device having an input surface, positioned below the output surface of the electron gain device, for receiving light from the output surface of the electron gain device, and a ceramic substrate disposed below the output surface of the electron gain device for housing the electron sensing device, wherein the ceramic substrate includes a pocket for housing the electron sensing device, and the pocket is of a predetermined depth, so that the top surface of the ceramic substrate is substantially coplanar with the input surface of the electron sensing device; and input/output pads are disposed on the top surface of the ceramic substrate, input/output pads are disposed on the input surface of the electron sensing device, and multiple conductive epoxy spanning between the input/output pads of the ceramic substrate and the electron sensing device to provide electrical connections; and non-conductive epoxy is disposed below at least one conductive epoxy span for providing support to the at least one conductive epoxy span.

6. The image intensifier of claim 5 wherein the electronic sensing device is an imager, and the electron gain device is an MCP.

* * * * *